(12) United States Patent
Raj et al.

(10) Patent No.: US 10,515,843 B2
(45) Date of Patent: Dec. 24, 2019

(54) AMALGAMATED COVER RING

(71) Applicant: Applied Materials, Inc., Santa Clara, CA (US)

(72) Inventors: Govinda Raj, Bangalore (IN); Hanish Kumar Panavalappil Kumarankutty, Bangalore (IN); Stanley Wu, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 410 days.

(21) Appl. No.: 15/371,849

(22) Filed: Dec. 7, 2016

(65) Prior Publication Data

US 2017/0162422 A1   Jun. 8, 2017

Related U.S. Application Data

(60) Provisional application No. 62/264,157, filed on Dec. 7, 2015.

(51) Int. Cl.
*H01L 21/687* (2006.01)

(52) U.S. Cl.
CPC .. *H01L 21/68721* (2013.01); *H01L 21/68735* (2013.01); *H01L 21/68757* (2013.01)

(58) Field of Classification Search
CPC . H01L 21/68; H01L 21/683; H01L 21/68721; H01L 21/68735; H01L 21/68757
See application file for complete search history.

(56) References Cited

U.S. PATENT DOCUMENTS

| 5,421,401 A | * | 6/1995 | Sherstinsky | ............ C23C 14/50 118/728 |
| 5,460,703 A | * | 10/1995 | Nulman | .................. C23C 14/50 118/503 |
| 5,725,718 A | * | 3/1998 | Banholzer | ......... H01L 21/68721 118/728 |

(Continued)

FOREIGN PATENT DOCUMENTS

| KR | 20150101786 A | 9/2015 |
| KR | 20150104813 A | 9/2015 |

OTHER PUBLICATIONS

International Search Report and Written Opinion for PCT/US2016/060823 dated Feb. 20, 2017.

*Primary Examiner* — Tyrone V Hall, Jr.
(74) *Attorney, Agent, or Firm* — Patterson + Sheridan LLP (57) ABSTRACT

The present disclosure generally relates to generally relates to equipment for performing semiconductor device fabrication, and more particularly, to a cover ring for partially covering a surface of a substrate support in high-density plasma chemical vapor deposition processing. In one embodiment, the cover ring may include an annular body, an inner support block with a beveled first edge for stability, one or more thermal breaks to increase thermal movement towards the outer diameter, a rounded shoulder to prevent particle deposition, an outer lip configured to a substrate support pedestal, a vertical appendage to support the substrate, and a thermally conductive coating disposed on the annular ring to direct thermal conductivity towards the outer edge of the ring and prevent particle accumulation.

20 Claims, 4 Drawing Sheets

(56) References Cited

U.S. PATENT DOCUMENTS

| | | | | |
|---|---|---|---|---|
| 5,810,931 A * | 9/1998 | Stevens | H01L 21/68721 | 118/500 |
| 5,930,661 A * | 7/1999 | Lu | C23C 16/4401 | 118/728 |
| 5,968,379 A * | 10/1999 | Zhao | C23C 16/45565 | |
| 6,162,336 A * | 12/2000 | Lee | C23C 14/50 | 118/500 |
| 6,189,483 B1 * | 2/2001 | Ishikawa | C23C 16/4405 | 118/723 E |
| 7,718,005 B2 * | 5/2010 | Handa | C23C 16/45521 | 118/695 |
| 7,927,424 B2 * | 4/2011 | Sidhwa | C23C 14/50 | 118/724 |
| 8,409,355 B2 * | 4/2013 | Rasheed | C23C 16/4581 | 118/725 |
| 8,617,672 B2 * | 12/2013 | Bhatnagar | H01L 21/67115 | 428/34.4 |
| 2003/0211757 A1 * | 11/2003 | Gondhalekar | C23C 16/45563 | 438/788 |
| 2004/0149226 A1 * | 8/2004 | Chen | H01L 21/68721 | 118/728 |
| 2005/0005859 A1 * | 1/2005 | Koshiishi | H01J 37/32642 | 118/728 |
| 2005/0133164 A1 * | 6/2005 | Fischer | H01J 37/32642 | 156/345.51 |
| 2007/0102286 A1 * | 5/2007 | Scheible | C23C 14/3407 | 204/298.01 |
| 2008/0178801 A1 * | 7/2008 | Pavloff | H01J 37/32477 | 118/504 |
| 2008/0261800 A1 * | 10/2008 | Yuan | C03B 32/00 | 501/152 |
| 2009/0025636 A1 * | 1/2009 | Rasheed | C23C 16/4585 | 118/500 |
| 2010/0059181 A1 * | 3/2010 | Lee | H01J 37/32623 | 156/345.51 |
| 2011/0126984 A1 * | 6/2011 | Kang | H01J 37/32091 | 156/345.51 |
| 2013/0230971 A1 * | 9/2013 | Geerpuram | H01J 37/32495 | 438/460 |
| 2016/0035610 A1 * | 2/2016 | Park | H01L 21/6833 | 156/345.29 |

* cited by examiner

AMALGAMATED COVER RING

CROSS-REFERENCE TO RELATED APPLICATIONS

This application claims benefit of U.S. Provisional Application Ser. No. 62/264,157, filed Dec. 7, 2015, of which is incorporated by reference in its entirety.

BACKGROUND OF THE DISCLOSURE

Field of the Disclosure

Embodiments of the present disclosure generally relate to semiconductor processing apparatus. More specifically, embodiments of the disclosure relate to an amalgamated cover ring suitable for use in high-density plasma chemical vapor deposition (HDP-CVD) substrate processing, among other uses.

Description of the Related Art

Fabricating modern semiconductor devices on thin film substrates using high-density plasma chemical vapor deposition (HDP-CVD) involves excitation and/or dissociation of reactant gases at low vacuum pressures by the application of radio-frequency energy to a reaction zone near the substrate surface, thereby creating plasma. During plasma processing, some process kits may be used to protect a substrate support during material deposition or etching.

However, components of the process kits, especially edge rings or cover rings sitting proximate the substrate, may also become covered with deposited materials from the process. Such materials may include corrosive materials, such as oxides or fluorides and the like, and may damage the substrate support. The materials may also flake off from the substrate support and contaminate the substrate being processed. Moreover, exposed metal surfaces of the substrate support may lead to arcing in the plasma process and metal contamination of the substrate and/or the chamber. In certain processes, materials sputtered off of the substrate proximate the substrate edge may be deposited upon the cover ring near the substrate edge, thereby increasing the buildup of materials on the process kit and shortening the mean time between cleaning.

Therefore, there is a need in the art for an improved cover ring.

SUMMARY OF THE DISCLOSURE

In one embodiment, a cover ring is disclosed. The cover ring may include an annular body having a first surface, a second surface substantially parallel to the first surface, an inner edge, and an outer edge. A support block may extend from the annular body and define at least a portion of the second surface. The support block may have a beveled edge extending from the inner edge of the annular body to the second surface of the annular body. One or more thermal breaks may be formed on the annular body adjacent to and radially outward from the support block and a rounded shoulder may extend from the first surface of the annular body to the outer edge of the annular body. A lip may be disposed proximate the outer edge and extend downward from the rounded shoulder and a groove may be formed in the annular body adjacent the lip. The groove may be disposed between the outer edge and the one or more thermal breaks. The cover ring also has a vertical appendage which includes a third surface extending from the first surface substantially parallel to the inner edge, a fourth surface orthogonal to the inner edge, and a beveled edge disposed between the third surface and the fourth surface. A thermally conductive coating may also be disposed on the second surface of the annular body.

In another embodiment, a cover ring may include an annular body having a first surface, a second surface substantially parallel to the first surface, an inner edge, and an outer edge. A support block may extend from the annular body and define at least a portion of the second surface. The support block may have a beveled edge extending from the inner edge of the annular body to the second surface of the annular body. One or more thermal breaks may be formed on the annular body adjacent to and radially outward from the support block and a rounded shoulder may extend from the first surface of the annular body to the outer edge of the annular body. A lip may be disposed proximate the outer edge and extend downward from the rounded shoulder and a groove may be formed in the annular body adjacent the lip. The groove may be disposed between the outer edge and the one or more thermal breaks. The cover ring may also have a vertical appendage which includes a third surface extending from the first surface substantially parallel to the inner edge, a fourth surface orthogonal to the inner edge, and a beveled edge disposed between the third surface and the fourth surface. A thermally conductive coating may also be disposed on the first surface of the annular body and the second surface of the annular body.

In another embodiment, a cover ring may include an annular body having a first surface, a second surface substantially parallel to the first surface, an inner edge, and an outer edge. A support block may extend from the annular body and define at least a portion of the second surface. The support block may have a beveled edge extending from the inner edge of the annular body to the second surface of the annular body. One or more thermal breaks may be formed on the annular body adjacent to and radially outward from the support block and a rounded shoulder may extend from the first surface of the annular body to the outer edge of the annular body. A lip may be disposed proximate the outer edge and extend downward from the rounded shoulder and a groove may be formed in the annular body adjacent the lip. The groove may be disposed between the outer edge and the one or more thermal breaks. The cover ring also has a vertical appendage which includes a third surface extending from the first surface substantially parallel to the inner edge, a fourth surface orthogonal to the inner edge, and a beveled edge disposed between the third surface and the fourth surface. A thermally conductive coating may also be disposed on the second surface of the annular body. The cover ring also may include one or more protrusions on the first surface of the annular body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to equipment for performing semiconductor device fabrication, and more particularly, to a cover ring for covering a surface of a substrate support in a plasma processing chamber, such as an etch chamber or chemical vapor deposition chamber, among others. In one embodiment, the cover ring may include an annular body. The annular body may include an inner support block with a beveled first edge for stability, one or more thermal breaks to increase thermal movement of heat adjacent the substrate towards the outer diameter of the cover ring, a rounded shoulder to prevent particle deposition, an outer lip configured to a substrate support pedestal, and a vertical appendage to support the substrate. A thermally conductive coating may also be disposed on the annular ring to direct thermal conductivity towards the outer edge of the ring and prevent particle accumulation.

Figure 1:
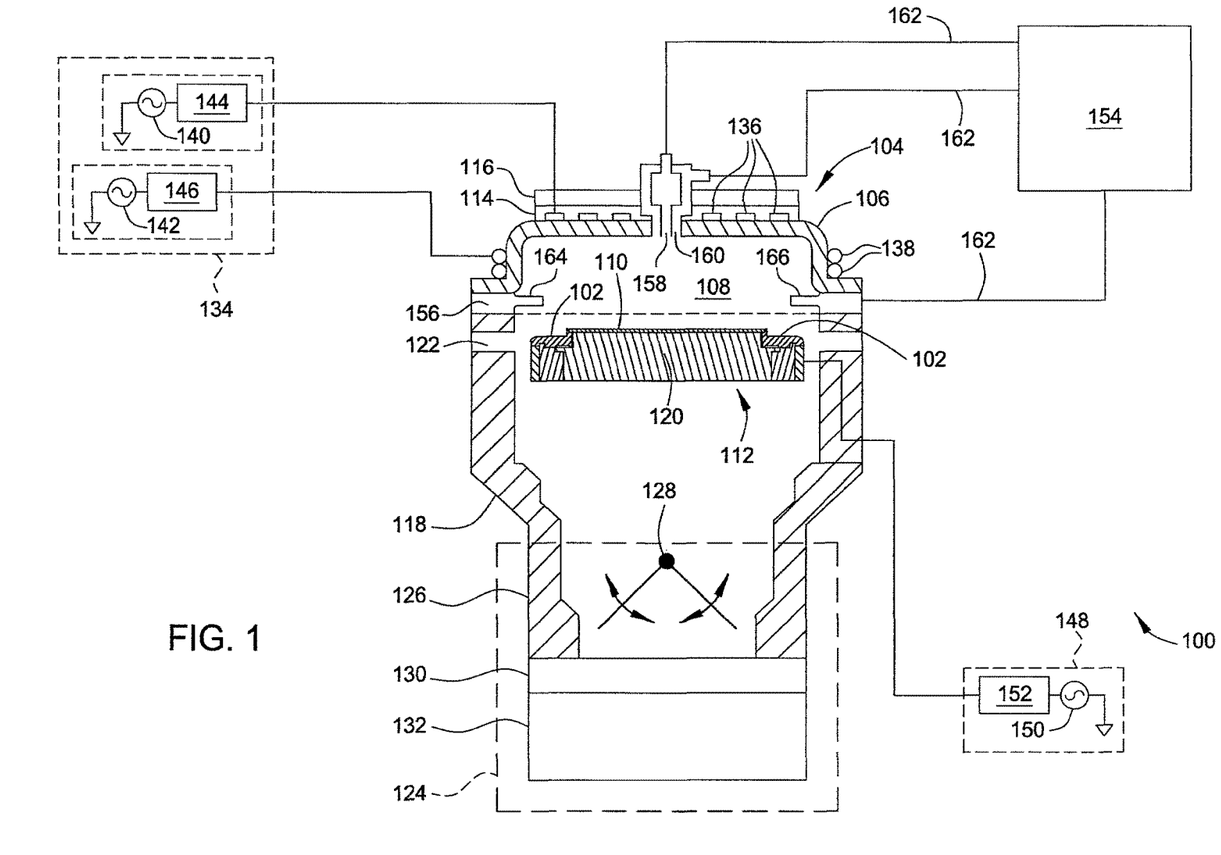
FIG. 1 schematically illustrates a processing chamber which includes a cover ring according to one embodiment.

FIG. 1 is a schematic representation of a plasma-based substrate processing system 100 including a cover ring 102 in accordance with various embodiments of the present disclosure. The plasma-based substrate processing system 100 can be used for temperature controlled processing of substrates, such as silicon substrates, GaAs substrates and the like, while creating and maintaining a plasma environment in which to process the substrates. Although one embodiment of a plasma processing chamber is described illustratively in a high density plasma-chemical vapor deposition (HDP-CVD) system, such as the 200 mm HDP-CVD Ultima X system available from Applied Materials, Inc. of Santa Clara, Calif., the disclosure has utility in other process chambers, including those from other manufacturers. Such chambers include physical vapor deposition chambers, chemical vapor deposition chambers, etch chambers, and other applications where a cover ring may prevent or limit contaminants resulting from processing the substrate from depositing on a surface of the substrate support and proximate the substrate being processed.

The plasma-based substrate processing system 100 includes a process chamber 104, a vacuum system 124, a bias plasma system 148, a source plasma system 134, and a gas delivery system 154. The process chamber 104 may include a substrate support 112 disposed therein for supporting a substrate 110 thereupon during processing. The substrate support 112 may include various components, such as an electrostatic chuck 120 to secure the substrate 110 to the substrate support 112. The cover ring 102 may be configured to cover at least a portion of the substrate support 112 that is not covered by the substrate 110 when the substrate 110 is disposed thereon to protect the substrate support 112 from unwanted deposition.

The process chamber 104 includes a dome 106 defining an upper boundary of a plasma processing region 108. The plasma processing region 108 is bounded on the bottom by the substrate 110 and the substrate support 112. A heater plate 114 and a cooling plate 116 are disposed on and are thermally coupled to the dome 106, allowing control of the temperature of the dome 106 for the various processes. Accurate control of the dome temperature also reduces the flake or particle counts in the process chamber and improves adhesion between a deposited layer and the substrate 110.

The process chamber 104 includes a chamber body 118 which defines a lower portion of the process chamber 104 and joins the process chamber 104 to the vacuum system 124. Substrates may be transferred into and out of process chamber 104 through a slit valve 122 formed in the chamber body 118 of process chamber 104. The vacuum system 124 includes a throttle body 126 which houses a throttle valve 128 and is attached to a gate valve 130 and a turbomolecular pump 132. The throttle body 126 may be configured to minimize gas flow obstruction and provide for symmetric pumping.

The source plasma system 134 includes a top coil 136 and a side coil 138 mounted on the dome 106. The top coil 136 is powered by a top RF source generator 140, while the side coil 138 is powered by a side RF source generator 142. Matching networks 144 and 146 match the output impedance of generators 140 and 142 with top coils 136 and side coils 138, respectively. The source plasma system 134 provides for independent power levels and frequencies of operation for each coil, thereby improving plasma uniformity and may improve plasma-generation efficiency.

The bias plasma system 148 includes a RF bias generator 150 and a bias matching network 152. The bias plasma system 148 serves to enhance the transport of plasma species created by the source plasma system 134 to the surface of the substrate 110.

The gas delivery system 154 may include a plurality of gas sources (not shown), gas delivery lines 162 (only some of which are shown), a gas ring 156 with a plurality of gas nozzles 164 and 166, a top nozzle 158, and a top vent 160. The gas delivery system 154 may be configured to deliver various precursors or processing gases, such as silane, molecular oxygen, helium, argon, and the like into the process chamber.

Figure 2:
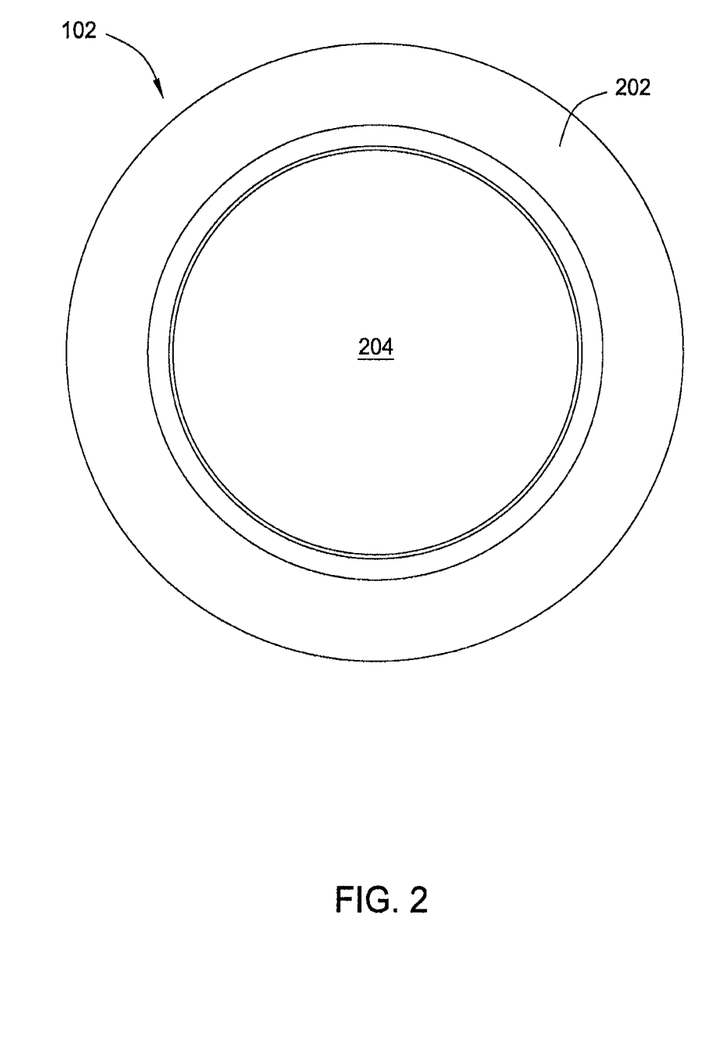
FIG. 2 illustrates a plan view of the cover ring of FIG. 1.

FIG. 2 illustrates a plan view of the cover ring 102 of FIG. 1. The cover ring 102 includes an annular body 202 which defines an opening 204. In one embodiment, the opening 204 is substantially circular. The opening 204 allows a portion of the electrostatic chuck 120 to extend therethrough when the cover ring 102 is disposed on the substrate support 112. The cover ring 102 may be formed from ceramic materials and is advantageously fabricated in one piece to help reduce particle accumulation. During processing, particle accumulation can occur in gaps between various components when a process kit is made up of multiple parts such as both a cover ring and collar ring thereby increasing ring erosion. Additionally, the particles that accumulate in the gaps can subsequently flake off and contaminate the substrate 110. Advantageously, however, when the cover ring 102 is one piece, particle accumulation is reduced thereby decreasing erosion and increasing the life of the cover ring. Additionally, the gaps formed by multiple pieces can disrupt the gas flow across the substrate. A unibody cover ring helps facilitate more uniform gas flow during processing.

Figure 3:
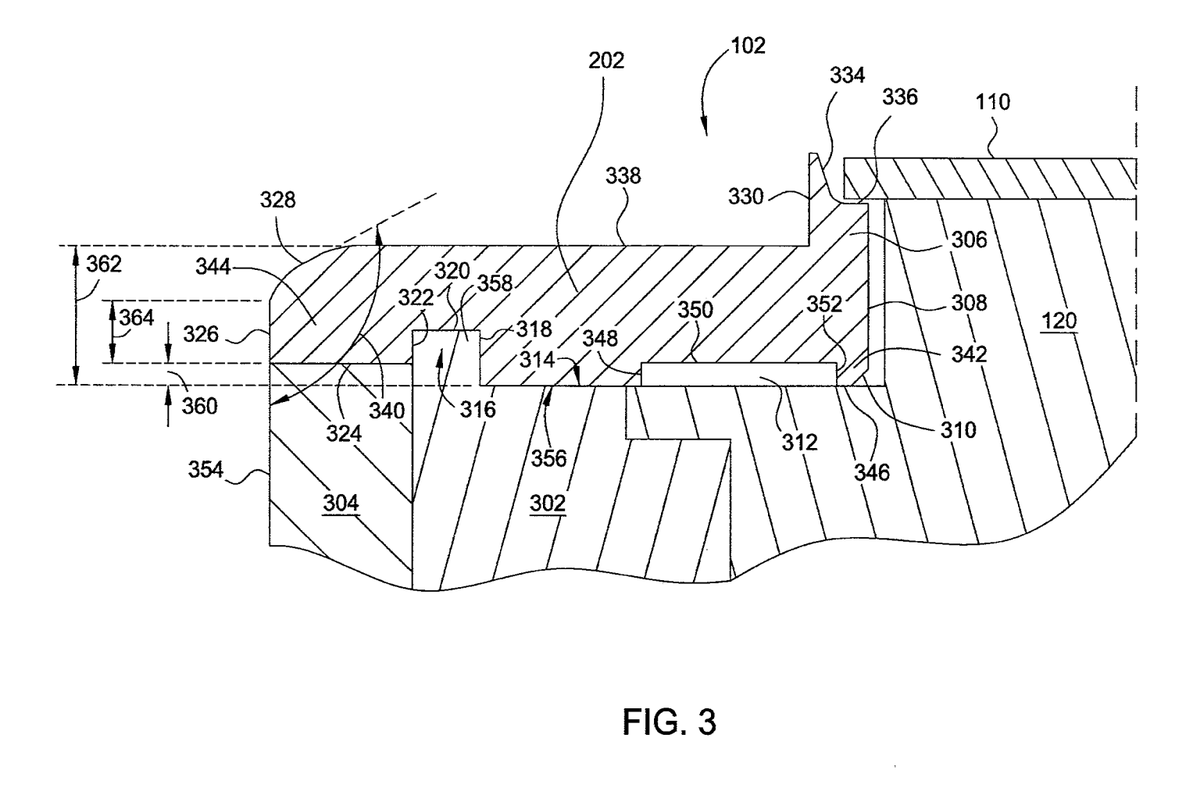
FIG. 3 illustrates a schematic, partial cross-sectional view of the cover ring of FIG. 1 disposed on a substrate support.

FIG. 3 illustrates a schematic, partial cross-sectional view of the cover ring 102 of FIG. 1 disposed on the substrate support 112. The cover ring 102 may be utilized with various different configurations of the substrate support 112. In one embodiment, the substrate support 112 may include the electrostatic chuck 120, an insulator 302, and a grounded electrically conductive block 304. The insulator 302 may be a dielectric material and may be disposed circumferentially about and adjacent to the electrostatic chuck 120. The conductive block 304 may be a metal such as aluminum (Al) and may be disposed circumferentially about and adjacent to the insulator 302. The annular body 202 of the cover ring 102 includes a first surface 338, a second surface 314 substantially parallel to the first surface 338, an inner edge 308, and an outer edge 326. The outer edge 326 may be proximate an outer edge 354 of the substrate support, and more specifically, in one embodiment, the electrically conductive block 304. The inner edge 308 of the annular body 202 may define the opening 204. The outside diameter of the cover ring 102 is between about 10.00 inches and about 12.00 inches. In one embodiment, the outside diameter of the cover ring is about 11.005 inches.

The annular body 202 further includes a first surface 338 and a second surface 314. In one embodiment, the first surface 338 is substantially planar. A distance 362 between the first surface 338 and the second surface 314 may be between about 0.355 inches and about 0.365 inches. A rounded shoulder 328 may extend from the first surface 338 of the annular body 202 to the outer edge 326 of the annular body 202. In one embodiment, the outer edge 326 may be substantially perpendicular to the first surface 338 of the annular body 202. The outer edge 326 may extend from the rounded shoulder 328 to a surface 324 of a lip 344 a distance 364 between about 0.100 inches and about 0.200 inches. In one embodiment, the outer edge 326 may extend about 0.123 inches from the rounded shoulder 328 to the surface 324 of the lip 344. In one embodiment, the rounded shoulder 328 may be disposed at an angle 340 between about 130° and about 140°, measured on the angle formed by the outer edge 326 and the rounded shoulder 328. For example, the angle 340 may be about 135°. The rounded shoulder 328 is disposed towards the outer edge 326 to help facilitate thermal conductivity downward toward the conductive block 304.

In one embodiment, the cover ring 102 may be fabricated from aluminum nitride (AlN). Aluminum nitride provides for desirable thermal properties. For example, aluminum nitride is more thermally conductive than other traditional materials, such as aluminum oxide. The increased thermal conductivity facilitates heat transfer away from the surface of the substrate 110 towards the outer edge 326 of the cover ring 102 as well as inside the chamber by directing the heat away from the substrate 110. The reduced temperatures advantageously decrease the surface reaction on the chamber and reduce particle accumulation that can occur on the backside of the substrate 110 and the chamber.

The second surface 314 may have a profile configured to contact an upper surface 356 of the insulator 302 and help facilitate transferring the heat away from the substrate 110 and towards the outer edge 326. Heat conduction is minimized between the annular body 202 and the insulator 302 and preferentially directed to and conducted through to the conductive block 304. The annular body 202 also may include a groove 316 configured to interface with an upper extension 358 of the insulator 302. The groove 316 formed in the annular body 202 may be defined by a first surface 318, a second surface 320, and a third surface 322. The first surface 318 is opposite the third surface 322 and orthogonal to the second surface 320. The first surface 318 is also orthogonal to the second surface 314 of the annular body 202. The first surface 318 may have a diameter of between about 9.000 inches to about 10.000 inches. In one embodiment, the diameter of the first surface 318 is about 9.910 inches. The third surface 322 may have a diameter of between about 10.100 inches to about 10.900 inches. In another embodiment, the diameter of the third surface 322 is about 10.300 inches.

The annular body 202 further may include the lip 344 disposed proximate the outer edge 326 of the annular body 202 and extending from the rounded shoulder 328. The surface 324 of the lip 344 may be on a plane elevated above a plane of the second surface 314 of the annular body 202 and configured to interface with the conductive block 304. As heat is directed towards the outer edge 326, the lip 344 contacts the conductive block 304 to transfer heat away from the substrate 110. A distance 360 in height between the surface 324 of the lip 344 and the second surface 314 of the annular body 202 may be about 0.055 inches. The lip 344 is advantageously configured to interface with the conductive block 304 thereby providing a tight seal increasing thermal conductivity away from the substrate 110.

The annular body 202 may also include a vertical appendage 306. The vertical appendage 306 may include a first surface 330 extending from and orthogonal to the first surface 338 of the annular body 202, a second surface 334, and a third surface 336 orthogonal to the inner edge 308. In one embodiment, the second surface 334 is a slanted beveled edge. The second surface 334 may be disposed between the first surface 330 and the third surface 336. The vertical appendage 306 may advantageously facilitate centering the substrate 110 atop the substrate support 112 providing for a more uniform deposition. The substrate 110 may be parallel to and extend over the third surface 336 of the vertical appendage 306. The vertical appendage 306 may be a continuous ring or may be one or more vertical appendages forming one or more discontinuous posts. In one embodiment, four appendages are spaced 90 degrees apart, though greater or fewer appendages may be contemplated.

The annular body may also include a support block 342 having a beveled edge 310. The support block 342 has a surface 346 configured to contact the substrate support 112 and provide stability for the cover ring 102. The annular body 202 may also include one or more thermal breaks 312 formed on the annular body 202 adjacent to and radially outward from the support block 342. The thermal break 312 may include a first surface 348 orthogonal to a second surface 350 and a third surface 352. The thermal break 312 may be a recess minimizing contact between the surface of the cover ring 102 and the electrostatic chuck 120. By minimizing contact between the surfaces, the recess is a thermal break that advantageously provides for the heat to flow towards the outer edge 326. The third surface 352 may be opposite the first surface 348 and orthogonal to the surface 346 of the support block 342. In one embodiment, the thermally conductive coating is disposed on the one or more thermal breaks 312, specifically on the first surface 348, second surface 350, and third surface 352 of the thermal break 312.

Figure 4:
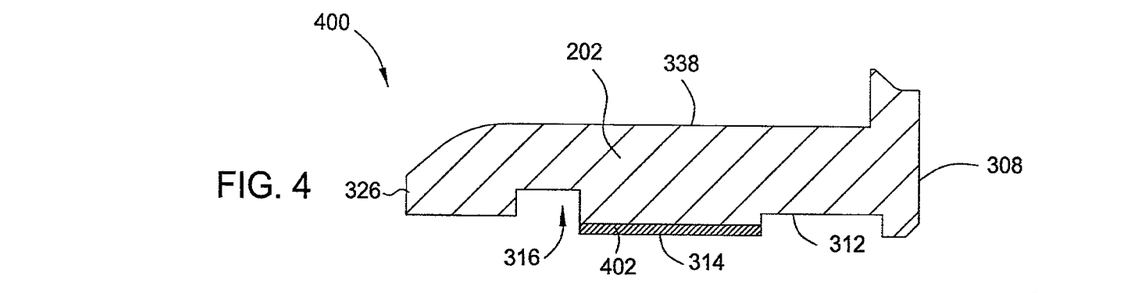
FIG. 4 illustrates a schematic, partial cross-sectional view of another embodiment of a cover ring.

FIG. 4 illustrates a schematic, partial cross-sectional view of another embodiment of a cover ring 400. The cover ring 400 includes the annular body 202. The annular body 202 of the cover ring 400 may include the first surface 338, the second surface 314 substantially parallel to the first surface 338, the inner edge 308, the outer edge 326, the thermal break 312, and the groove 316. The annular body 202 may also include a thermally conductive coating 402. In one embodiment, the thermally conductive coating 402 is disposed on the second surface 314 of the annular body 202. In one embodiment, the thermally conductive coating 402 may be a diamond-like carbon coating. Adjustments to temperature affects deposition on the substrate 110 during processing and being able to fine tune the temperature advantageously provides for more uniform deposition. As such, preferentially coating certain regions of the cover ring 400 with the thermally conductive coating 402 may increase the flow of heat towards the outer edge 326 of the cover ring 102. The reduced temperatures advantageously decrease the surface reaction on the chamber and reduce particle accumulation that can occur on the backside of the substrate 110. In one embodiment, the thermally conductive coating 402 may be conformal. In another embodiment, the thermally conductive coating 402 may be of uniform thickness.

Figure 5:
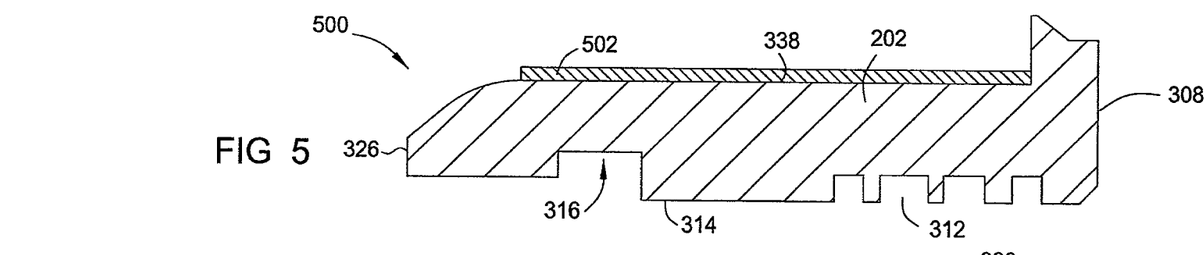
FIG. 5 illustrates a schematic, partial cross-sectional view of another embodiment of a cover ring according.

FIG. 5 illustrates a schematic, partial cross-sectional view of another embodiment of a cover ring 500. The cover ring 500 includes the annular body 202. The annular body 202 of the cover ring 500 may include the first surface 338, the second surface 314 substantially parallel to the first surface 338, the inner edge 308, the outer edge 326, the groove 316, and thermal break 312. The thermal break 312 may be a plurality of grooves formed in and extending along the second surface 314 of the annular body 202. The plurality of grooves or recesses minimizing contact between the second surface 314 of the cover ring 102 and the electrostatic chuck 120. By minimizing contact between the surfaces, the plurality of recesses is a thermal break 312 that advantageously provides for the heat to flow towards the outer edge 326.

The cover ring 500 may include a thermally conductive coating 502 disposed on the first surface 338 of the annular body 202. Preferentially coating the first surface 338 of the cover ring 500 with the thermally conductive coating 502 may increase the flow of heat towards the outer edge 326 of the cover ring 500 thereby reducing particle deposition near the surface of the substrate 110. The thermally conductive coating 502 on the first surface 338 may be disposed between the vertical appendage 306 and the rounded shoulder 328. In addition to the thermally conductive coating 502 disposed on the first surface 338, the thermally conductive coating 402 may also be disposed on the second surface 314, similar to the embodiment illustrated in FIG. 4 such that the thermally conductive coating 502 is disposed on the first surface 338 and the thermally conductive coating 402 is disposed on the second surface 314. In one embodiment, the thermally conductive coating 502 may be a diamond-like carbon coating.

Figure 6:
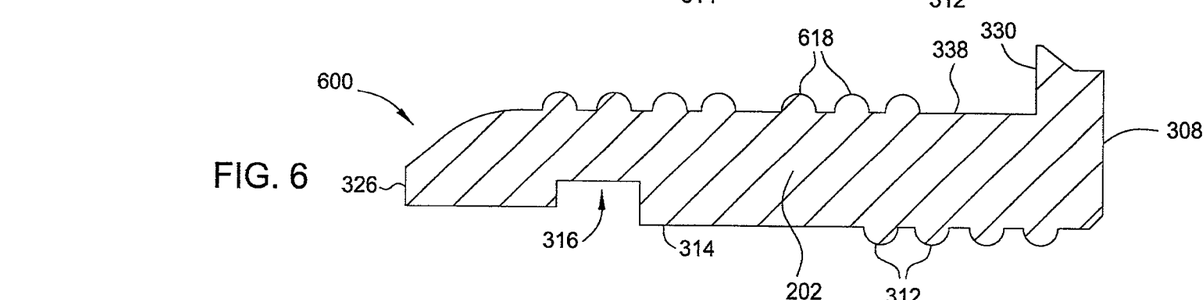
FIG. 6 illustrates a schematic, partial cross-sectional view of another embodiment of a cover ring.

FIG. 6 illustrates a schematic, partial cross-sectional view of another embodiment of a cover ring 600. The cover ring 600 includes the annular body 202. The annular body 202 of the cover ring 600 may include the first surface 338, the second surface 314 substantially parallel to the first surface 338, the inner edge 308, the outer edge 326, the groove 316, and thermal break 312. The thermal break 312 may be protrusions extending outward from the annular body 202. The protrusions minimize contact between the second surface 314 of the cover ring 102 and the electrostatic chuck 120. By minimizing contact between the surfaces, the protrusions are a thermal break that advantageously provides for the heat to flow away from the substrate 110. While protrusions, such as bumps are shown, thermal breaks of various geometries may be used. For example, the thermal break 312 may be rectangular or square shaped protrusions extending outward from the annular body 202.

The annular body 202 may also include a coating 618 disposed on the first surface 338 to improve particle retention of films deposited on the first surface 338 during substrate processing. The coating 618 generally includes protrusions which provide micro or macro texturing on the first surface 338. In one embodiment, the coating 618 may be the Lava Coat or Lava Coat II coating available from Applied Materials, Inc., Santa Clara, Calif. Although the coating 618 is shown as rounded, semicircular protrusions, the surface texturing of the coating 618 can have various other shapes and geometries. The protrusions of the coating 618 may be discrete protrusions separate from adjacent protrusions. In one embodiment, the surface texturing of the coating 618 may have a wave profile to improve particle adhesion. The wave profile of the coating 618 may be formed by etching, bead or grit, blasting, laser ablation, or 3D printing. In one embodiment, the coating 618 may extend the length of the first surface 338 of the annular body 202.

Embodiments of cover rings provided herein may advantageously provide for specific thermal profiles that direct heat away from the substrate and towards the edge of the substrate support thus reducing particle accumulation and subsequent substrate contamination.

While the foregoing is directed to embodiments of the present disclosure, other and further embodiments of the disclosure may be devised without departing from the basic scope thereof, and the scope thereof is determined by the claims that follow.

The invention claimed is:

1. A cover ring, comprising:
an annular body having a first surface, a second surface substantially parallel to the first surface, an inner edge, and an outer edge;
a support block extending from the annular body and defining at least a portion of the second surface, wherein the inner edge forms a portion of the support block and the support block has a beveled edge extending from the inner edge of the annular body to the second surface of the annular body;
one or more thermal breaks formed on the annular body adjacent to and radially outward from the support block;
a rounded shoulder extending from the first surface of the annular body to the outer edge of the annular body;
a lip disposed proximate the outer edge and extending downward from the rounded shoulder, the lip having a bottom surface, wherein a first vertical distance from the bottom surface to the first surface is less than a second vertical distance from the first surface to the second surface;
a groove formed in the annular body adjacent the lip, wherein the groove is disposed between the outer edge and the one or more thermal breaks;
a vertical appendage comprising a third surface extending from the first surface away from the second surface and substantially parallel to the inner edge, a fourth surface orthogonal and connected to the inner edge, and a beveled edge extending downward from the third surface to the fourth surface; and
a thermally conductive coating disposed on the second surface of the annular body.

2. The cover ring of claim 1, wherein the thermally conductive coating is disposed on a first portion of the second surface defined by the support block.

3. The cover ring of claim 1, wherein the thermally conductive coating is disposed on a first portion of the second surface defined by the support block and a second portion of the second surface disposed between the groove and the one or more thermal breaks.

4. The cover ring of claim 1, wherein the lip comprises a fifth surface extending from the outer edge to the groove, and wherein a first distance from the first surface to the fifth surface is less than a second distance from the first surface to the second surface.

5. The cover ring of claim 1, wherein the cover ring is made of aluminum nitride.

6. The cover ring of claim 1, wherein the vertical appendage is a continuous ring.

7. A cover ring, comprising:
an annular body having a first surface, a second surface substantially parallel to the first surface, an inner edge, and an outer edge;
a support block extending from the annular body and defining at least a portion of the second surface, wherein the support block has a beveled edge extending from the inner edge of the annular body to the second surface of the annular body;
one or more thermal breaks formed on the annular body adjacent to and radially outward from the support block;
a rounded shoulder extending from the first surface of the annular body to the outer edge of the annular body;
a lip disposed proximate the outer edge and extending downward from the rounded shoulder, the lip having a bottom surface, wherein a first vertical distance from the bottom surface to the first surface is less than a second vertical distance from the first surface to the second surface;
a groove formed in the annular body adjacent the lip, wherein the groove is disposed between the outer edge and the one or more thermal breaks;
a vertical appendage comprising a third surface extending from the first surface away from the second surface and substantially parallel to the inner edge, a fourth surface orthogonal and connected to the inner edge, and a beveled edge disposed between the third surface and the fourth surface; and
a thermally conductive coating disposed on the first surface and the second surface of the annular body.

8. The cover ring of claim 7, further comprising one or more protrusions extending from the first surface of the annular body.

9. The cover ring of claim 7, wherein the thermally conductive coating is disposed on the first surface of the annular body between the vertical appendage and the rounded shoulder.

10. The cover ring of claim 7, wherein the thermally conductive coating is a diamond-like carbon material.

11. The cover ring of claim 7, wherein the rounded shoulder is disposed at an angle of about 135 degrees, measured on the angle formed by the outer edge and the rounded shoulder.

12. The cover ring of claim 7, wherein the annular body is aluminum nitride.

13. The cover ring of claim 7, wherein the one or more thermal breaks extend from the second surface of the annular body.

14. A cover ring, comprising:
an annular body having a first surface, a second surface substantially parallel to the first surface, an inner edge, and an outer edge;
a support block extending from the annular body and defining at least a portion of the second surface, wherein the support block has a beveled edge extending from the inner edge of the annular body to the second surface of the annular body;
one or more thermal breaks formed on the annular body adjacent to and radially outward from the support block;
a rounded shoulder extending from the first surface of the annular body to the outer edge of the annular body;
a lip disposed proximate the outer edge and extending downward from the rounded shoulder, the lip having a bottom surface, wherein a first vertical distance from the bottom surface to the first surface is less than a second vertical distance from the first surface to the second surface;
a groove formed in the annular body adjacent the lip, wherein the groove is disposed between the outer edge and the one or more thermal breaks;
a vertical appendage comprising a third surface extending from the first surface away from the second surface and substantially parallel to the inner edge, a fourth surface orthogonal and connected to the inner edge, and a beveled edge disposed between the third surface and the fourth surface;
a thermally conductive coating disposed on the second surface of the annular body; and
one or more protrusions disposed on the first surface of the annular body.

15. The cover ring of claim 14, wherein the one or more thermal breaks are bumps protruding outward from the annular body.

16. The cover ring of claim 15, wherein the one or more protrusions on the first surface of the annular body have a wave profile.

17. The cover ring of claim 14, wherein the rounded shoulder is disposed at an angle between about 130 degrees and about 140 degrees, measured on the angle formed by the outer edge and the rounded shoulder.

18. The cover ring of claim 14, wherein the thermally conductive coating is a diamond-like carbon material.

19. The cover ring of claim 14, wherein the vertical appendage extends from the first surface of the annular body and defines a circumference of an inner diameter of the annular body.

20. The cover ring of claim 14, wherein the vertical appendage extending from the first surface of the annular body comprises one or more discontinuous posts circumferentially spaced about 90 degrees apart.

* * * * *